(12) United States Patent
Van Blerkom et al.

(10) Patent No.: US 7,292,071 B2
(45) Date of Patent: Nov. 6, 2007

(54) METHOD AND CIRCUIT FOR SAMPLING/HOLDING A SIGNAL

(75) Inventors: Daniel Van Blerkom, Pasadena, CA (US); Steven Lei Huang, Pasadena, CA (US); I-Shiou Chen, Hsinchu (TW); Te-Sung Su, Hsinchu County (TW)

(73) Assignee: Sunplus Technology Co., Ltd., Hsinchu County (TW)

( * ) Notice: Subject to any disclaimer, the term of this patent is extended or adjusted under 35 U.S.C. 154(b) by 53 days.

(21) Appl. No.: 10/905,805

(22) Filed: Jan. 21, 2005

(65) Prior Publication Data
US 2005/0237089 A1    Oct. 27, 2005

(30) Foreign Application Priority Data
Apr. 26, 2004    (TW) .................................. 93111564 A

(51) Int. Cl.
G11C 27/02    (2006.01)
(52) U.S. Cl. .............................. 327/94; 327/92; 327/93
(58) Field of Classification Search ............ 327/91–96
See application file for complete search history.

(56) References Cited

U.S. PATENT DOCUMENTS

| | | | | |
|---|---|---|---|---|
| 5,477,481 A | * | 12/1995 | Kerth | 708/819 |
| 6,181,748 B1 | * | 1/2001 | Lin et al. | 375/257 |
| 6,720,799 B2 | * | 4/2004 | Gupta | 327/92 |
| 2004/0130356 A1 | * | 7/2004 | Higashi et al. | 327/94 |

* cited by examiner

Primary Examiner—Tuan T. Lam
Assistant Examiner—William Hernandez
(74) Attorney, Agent, or Firm—Jianq Chyun IP Office

(57) ABSTRACT

A circuit and method thereof for sampling/holding signal is provided. The signal sampling/holding circuit comprises a first signal sampling/holding device, a second signal sampling/holding device, a target signal and a reference voltage. First, the first signal sampling/holding device is supplied with the reference voltage and the target signal. The reference voltage is disconnected from the first signal sampling/holding device before the target signal is. Similarly, the reference voltage is disconnected from the second signal sampling/holding device before the target signal is. Thus the target signal is respectively sampled and held in the first signal sampling/holding device and the second signal sampling/holding device.

16 Claims, 6 Drawing Sheets

METHOD AND CIRCUIT FOR SAMPLING/HOLDING A SIGNAL

CROSS-REFERENCE TO RELATED APPLICATION

This application claims the priority benefit of Taiwan application serial no. 93111564, filed Apr. 26, 2004.

BACKGROUND OF THE INVENTION

1. Field of Invention

The present invention relates to a method and circuit thereof for signal sampling/holding, and more particularly, to a method of signal sampling/holding for lowering sampling noise.

2. Description of the Related Art

Signal sampling/holding is one of the major issues of electronic circuits. In order to capture signal characteristics efficiently, a proper signal sampling/holding is exerted. Taking an image sensor as an example, a signal sampling/holding circuit serves to sample and hold an image sensing signal precisely for further processing in back-end circuits. Increasing electronic products are featured with built-in video capturing function, for example, mobile phones, PDA and toys, etc. In order to be adapted to various requirements, especially portable electronic devices, an image sensor with lower power consumption and high resolution is desirable.

Referring to FIG. 1A, it illustrates a block diagram of a conventional image sensor. In FIG. 1A, the conventional image sensor comprises a pixel array 110, a row driver and a voltage reference 120, a sample and hold charge mode readout circuit 130, a gain stage 140 and an A/D converter 150. The row driver and voltage reference 120 provides a reference voltage VCL for each of the row driving signals 121 and the reference voltages 122. Each row electrode (not shown) of the pixel array 110 respectively receives a corresponding row driving signal 121, and the pixel array senses outputs column pixel signals 111 according to a timing signal of the row driving signal 121 after image is sensed by the pixel array 110. The sample and hold charge mode read out circuit 130 simultaneously receives, samples and holds each of the column pixel signals 111, and outputs the pixel signal 131 in cascade manner in response to the pixel signals. The gain stage 140 receives and amplifiers the pixel signal 131 and generates pixel signal 141. The A/D converter 150 is an A/D converter, e.g. a pipeline A/D converter, converting the analog pixel signals 141 into digital pixel signal 151 in response to the reference voltage 122, for further processing with the back-end circuits, e.g. a control logic 160 in this image sensor.

In the sample and hold charge mode readout circuit 130 of the image sensor, a pixel signal is captured to a sampling device (e.g. a capacitor) via a sampling switch. The charges that cause noise is transferred to the signal that is sampled during switching off the sampling switch, which is referred to random signal noise to the image, and image quality is thus lowered. Since the sampling switch noise of the pixel signal is randomly generated, it is hardly filtered out in the back-end circuits. For description purpose, a CMOS image sensor is illustrated as an example hereinafter. Referring to FIG. 1B, it illustrates a schematic circuit diagram of a sample and hold column circuit of a CMOS image sensor. For depicting purpose, one of the pixels in the pixel array is illustrated as a pixel 112 in FIG. 1B. Moreover, the sample and hold column circuit comprises a plurality of sample/hold circuits, wherein one circuit is illustrated as an example.

Referring to FIG. 1C, it illustrates a temporal waveform diagram of signals of the sample and hold circuit of the CMOS image sensor in FIG. 1B. Referring to FIGS. 1B and 1C, a CMOS image sensor requires a sampled pixel signal value and a sampled reset signal value, whereas a reference voltage VCL is required for sampling reference. A gate of a signal follower sf is coupled to a cathode of a photo diode PD. During period A for sampling pixel signal value, control signals row_en, clamp and samp_sig are switched to high logic level, whereas control signals rst_en, samp_rst, cb and col_addr are switched to low logic level. The photo diode PD is radiated by light, such that a reverse bias potential across the two terminals of the photo diode PD are lowered correspondingly, and a potential difference between the pixel signal value outputted via the signal follower sf and the reference voltage VCL is stored in the capacitor CS1. During period B for sampling reset signal value, the control signals row_en, rst_en, clamp and samp_rst are switched to high logic level, whereas the control signals samp_sig, cb and col_addr are switched to low logic level. Where the cathode of the photo diode PD is re-coupled to the system potential Vaa, from which a corresponding reset signal value of the signal follower sf is outputted. A potential difference between the reset signal value and the reference voltage VCL is thus stored in the capacitor CS2.

After pixel signal is sampled, the control signals samp_sig and samp_rst are switched to low logic level, and a sensing switch of the control signal clamp is switched off before entering period C for signal value holding. During period C for signal value holding, each of row pixel signals 111 is respectively held in one of the corresponding sample/hold circuits, where each of the sample/hold circuits sequentially switches on the sensing switches controlled by the control signals cb and col_addr in response to a timing signal, and pixel signals (including the pixel signal value and the reset signal value) 131 is outputted in sequence to the gain stage 140.

When period A for sampling pixel signal value is terminated, the sensing switch is turned off by the control signal samp_sig, i.e., the sensing switch is changed from on status to off status, an inevitable problem occurs. That is, the charges are distributed randomly along the sensing switch, and thus are transferred to the sampled pixel signal value as random noise. Moreover, before period B for sampling reset signal value is terminated, the sensing switch is turned off by the control signal samp_sig, i.e., the sensing switch is changed from open status to off status, an inevitable problem as well occurs. That is, the charges are distributed randomly along the sensing switch, and thus are transferred to the sampled pixel signal value as random noise. The foregoing random noise is referred as front-end noise of the data path, which is hardly filtered out by back-end circuits. When the pixel signal is amplified, the random noise is as well amplified with the pixel signal, thus a signal over noise ratio (S/N ratio) is lowered as well as image quality.

SUMMARY OF THE INVENTION

In the light of the above description, the present invention is directed to a method of signal sampling/holding, for eliminating sampled signal noise caused by charge injection when sensing switch is switched.

The present invention is also directed to a circuit of signal sampling/holding, using simplified method steps, fixed circuit area and similar power consumption, sampled signal noise caused by charge injection when switching the sensing switch is avoided.

The present invention is also directed to a method of signal sampling/holding, using simplified circuit and timing control technique, fixed circuit area and similar power consumption, sampled signal noise caused by charge injection when switching the sensing switch is avoided.

According to an embodiment of the present invention, the method of signal sampling/holding is used for a signal sampling/holding circuit, where the signal sampling/holding circuit comprises a first signal sampling/holding device, a second signal sampling/holding device, a target signal source and a reference voltage. The method of signal sampling/holding comprises the following steps. First, coupling the reference voltage to the first signal sampling/holding device. Then, coupling the reference voltage to the second signal sampling holding device. Then, coupling the target signal source to the first signal sampling/holding device before coupling the target signal source to the second signal sampling/holding device. Afterwards, disconnecting the reference voltage before disconnecting the target signal source, where the target signal source is sampled and held in the first signal sampling/holding device. Lastly, disconnecting the reference voltage from the second signal sampling/holding device before disconnecting the target signal source, where the target signal source is sampled and held in the second signal sampling/holding device.

According to the method of signal sampling/holding, sampling and holding the target signal source in the first signal sampling/holding device is rendered before sampling and holding the target signal source in the second sampling/holding device.

According to an embodiment of the present invention, the circuit of signal sampling/holding is provided. The signal sampling/holding circuit is coupled to the target signal source and the reference voltage, where the signal sampling/holding circuit samples and holds the target signal source in response to the reference voltage and outputs a first voltage signal and a second voltage signal, wherein the signal sampling/holding circuit comprises a first signal sampling/holding device, a second signal sampling/holding device, a first sensing switch, a second sensing switch, a third sensing switch and a fourth sensing switch. The first signal sampling/holding device has a first terminal and a second terminal. The second signal sampling/holding device has a third terminal and a fourth terminal. A terminal of the first sensing switch is coupled to the first terminal, from which the first voltage signal is read, and the other terminal of the first sensing switch is coupled to the reference voltage. A terminal of the second sensing switch is coupled to the second terminal, and the other terminal of the second sensing switch is coupled to the target signal source. A terminal of the third sensing switch is coupled to the third terminal, from which the second voltage signal is read, and the other terminal of the third sensing switch is coupled to the reference voltage. A terminal of the fourth sensing switch is coupled to the fourth terminal, and the other terminal of the fourth sensing switch is coupled to the target signal source. Wherein, as the target signal source is sampled and held by the first signal sampling/holding device, the first sensing switch is turned off before the second sensing switch is turned off for holding and outputting the first voltage signal. As the target signal is sampled by the second signal sampling/holding device, the third sensing switch is turned off before the fourth sensing switch is turned off for holding and outputting the second voltage signal.

The circuit of signal sampling/holding according to one embodiment of the present invention further comprises a fifth sensing switch. A terminal of the fifth sensing switch is coupled to the second terminal, and the other terminal of the fifth sensing switch is coupled to the fourth terminal.

In the circuit of signal sampling/holding according to one embodiment of the present invention, the first signal sampling/holding device and the second signal sampling/holding device are both capacitors, for example.

According to another embodiment of the present invention, a method of signal sampling/holding comprises the following steps. First, providing a signal sampling/holding device. Coupling the target signal to the signal sampling/holding device, and coupling the target signal to the signal sampling/holding device. Lastly, disconnecting the reference voltage before disconnecting the target signal, where the target signal is sampled and held in the signal sampling/holding device.

According to another embodiment of the present invention, a circuit of signal sampling/holding is coupled to a target signal and a reference voltage. The signal sampling/holding circuit samples and holds the target signal in response to the reference voltage. The signal sampling/holding circuit comprises a signal sampling/holding device, a first sensing switch and a second sensing switch. The signal sampling/holding device has a first terminal and a second terminal. A terminal of the first sensing switch is coupled to the first terminal, the other terminal of the first sensing switch is coupled to the reference voltage. A terminal of the second sensing switch is coupled to the second terminal, the other terminal of the second sensing switch is coupled to the target signal. Where the first sensing switch and the second sensing switch are turned on for sampling the target signal, and disconnecting the first sensing switch before disconnecting the second sensing switch for holding the sampled result.

The signal sampling/holding circuit according to one embodiment of the present invention, wherein the signal sampling/holding device is a capacitor, for example.

According to the above description, sampling noise is lowered with the timing control technique in the present invention without increasing circuit area and power consumption. Since signal sampling switch noise is randomly generated, which is hardly to be filtered out in back-end circuit, it is more efficient to be removed in front-end circuit. Disconnecting the reference voltage before switching the sampling switch avoids sampling switch noise, such that S/N ratio is higher as desired.

DESCRIPTION OF THE EMBODIMENTS

In electronic circuits, it has been emphasized to precisely sample and hold a specific target signal, and to capture signal characteristics for better product performance. Take an image sensor as an example; if the image sensor samples and holds a poor signal, e.g. low S/N ratio, the image quality is lowered. In the following description, a CMOS image sensor is exemplary, yet not limiting the spirits and scope of the invention.

Figure 1A:
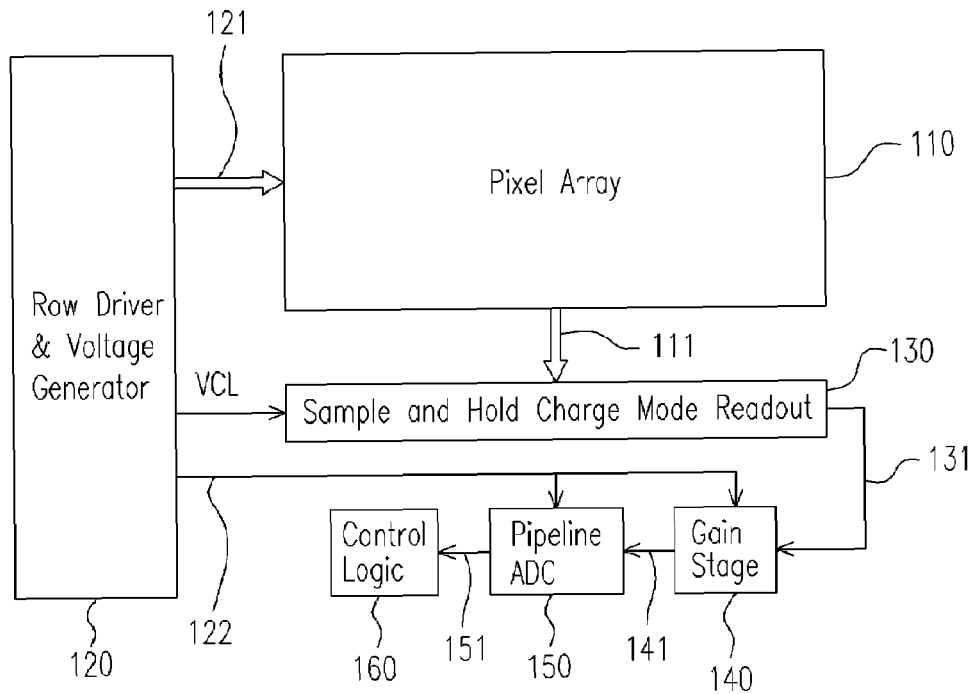
FIG. 1A is a schematic block diagram illustrating a conventional image sensor.
Figure 1B:
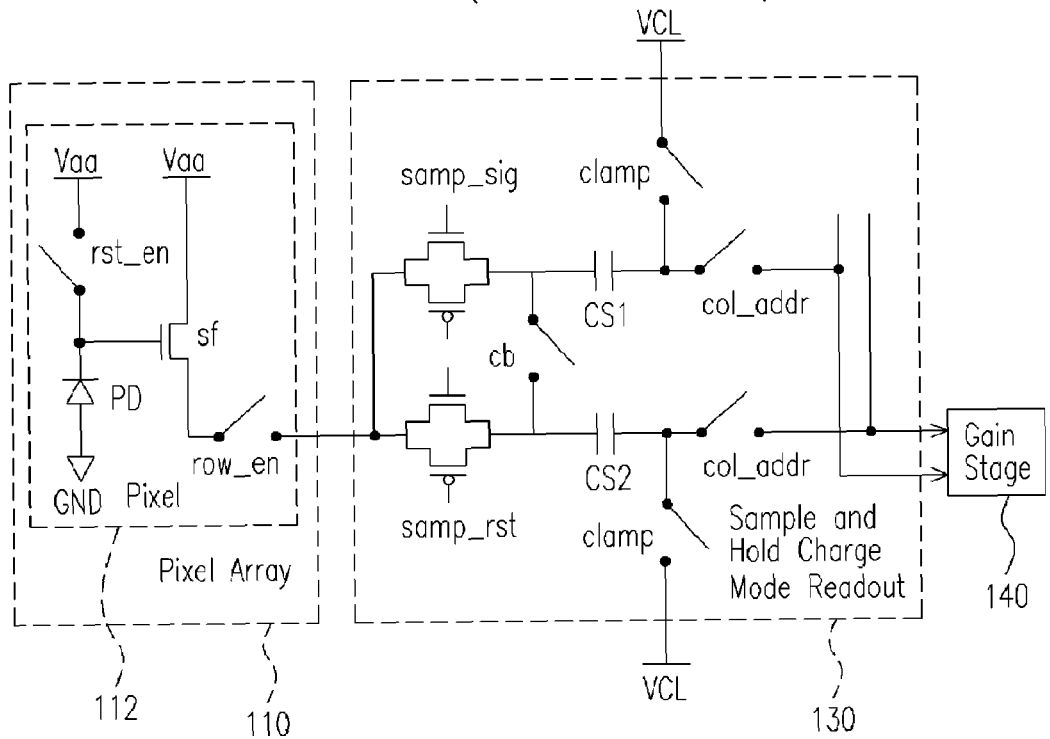
FIG. 1B is a schematic circuit diagram illustrating a sample/hold circuit of a conventional CMOS image sensor.
Figure 1C:
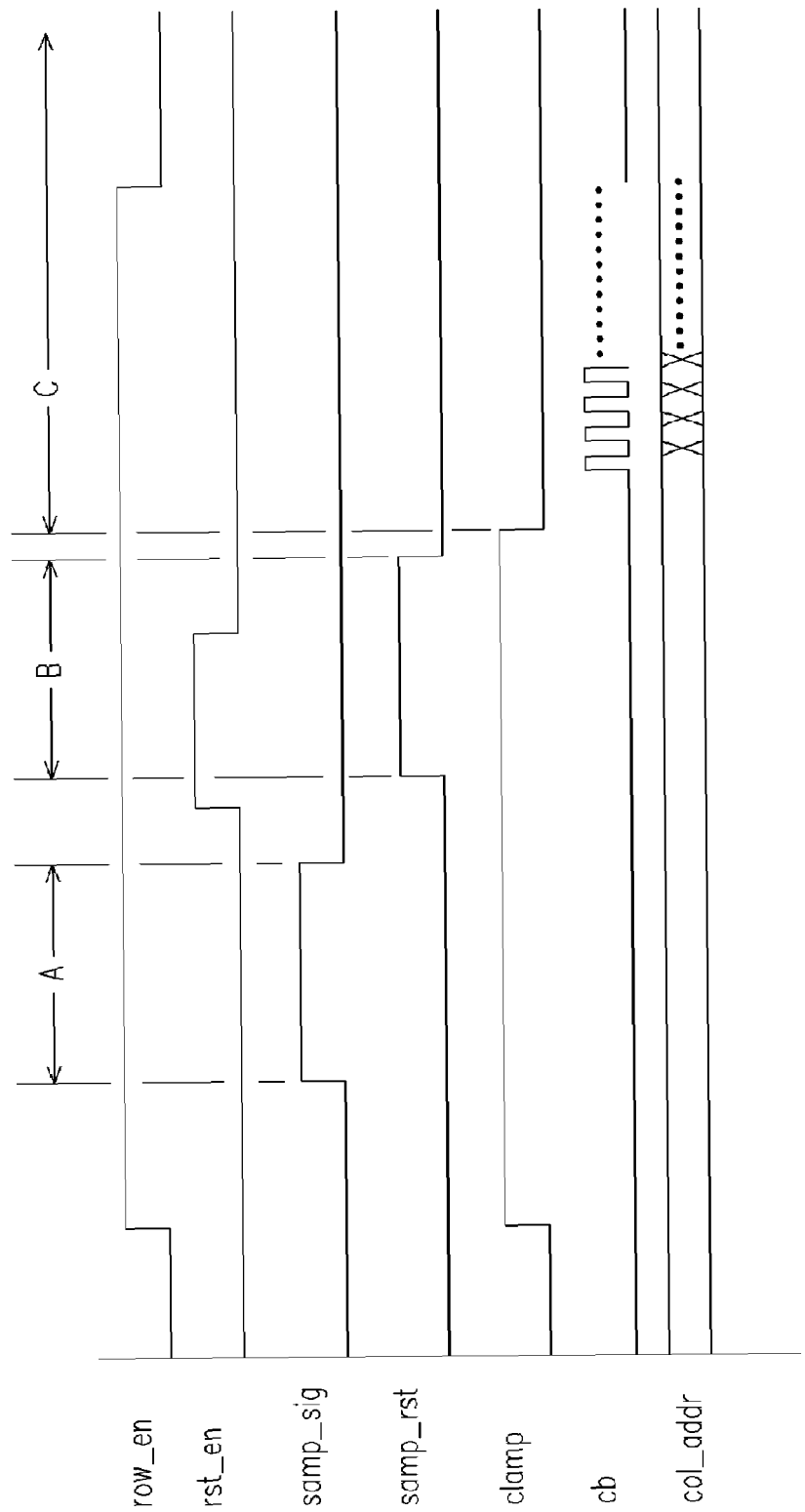
FIG. 1C is a schematic temporal waveform diagram illustrating signals of the sample/hold circuit of the CMOS image sensor in FIG. 1B.
Figure 2:
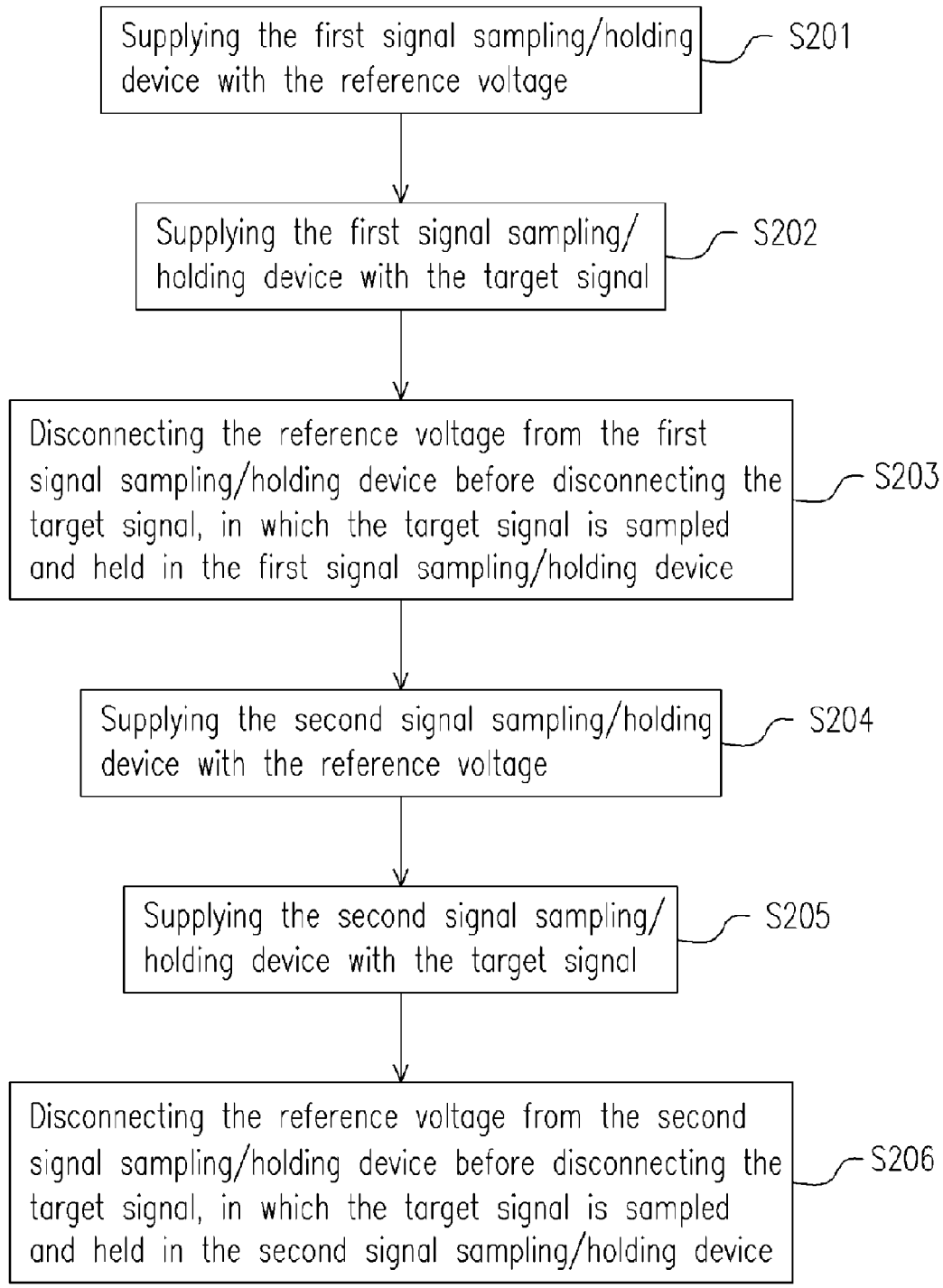
FIG. 2 is a schematic diagram illustrating a signal sampling/holding method according to one embodiment of the present invention.

Referring to FIG. 2, it illustrates a schematic flowchart diagram of a method for signal sampling/holding according to one embodiment of the present invention. In FIG. 2, the method is used for a signal sampling/holding circuit, including a first signal sampling/holding device and a second sampling/holding device, and further including a target signal source and a reference voltage. The first signal sampling/holding device and the second signal sampling/holding device are implemented with a first capacitor and a second capacitor respectively, for example. Coupling the reference voltage to the signal sampling/holding device (step S201), then coupling the target signal source to the first signal sampling/holding device (step S202), where the first signal sampling/holding device stores a difference between the target signal and the reference voltage therein. Proceeding to step S203, disconnecting the target signal and the reference voltage from the first signal sampling/holding device. In other words, the reference voltage is disconnected before the target signal is disconnected, such that the target signal is held in the first signal sampling/holding device.

After the steps rendering on the first signal sampling/holding device, proceeding to step S204, i.e. coupling the reference voltage to the second signal/sampling device. Then coupling the target signal source to the second signal sampling/holding device (step S205), where the second signal sampling/holding device stores a potential difference between the target signal and the reference voltage in the second signal sampling/holding device therein. Proceeding to step S206, disconnecting the target signal and the reference voltage from the second signal sampling/holding device. That is, the reference voltage is disconnected before the target signal is disconnected, such that the target signal is held in the second signal sampling/holding device.

According to one embodiment of the present invention, the target signal source is a voltage signal, for example, or an image sensor signal.

Figure 3A:
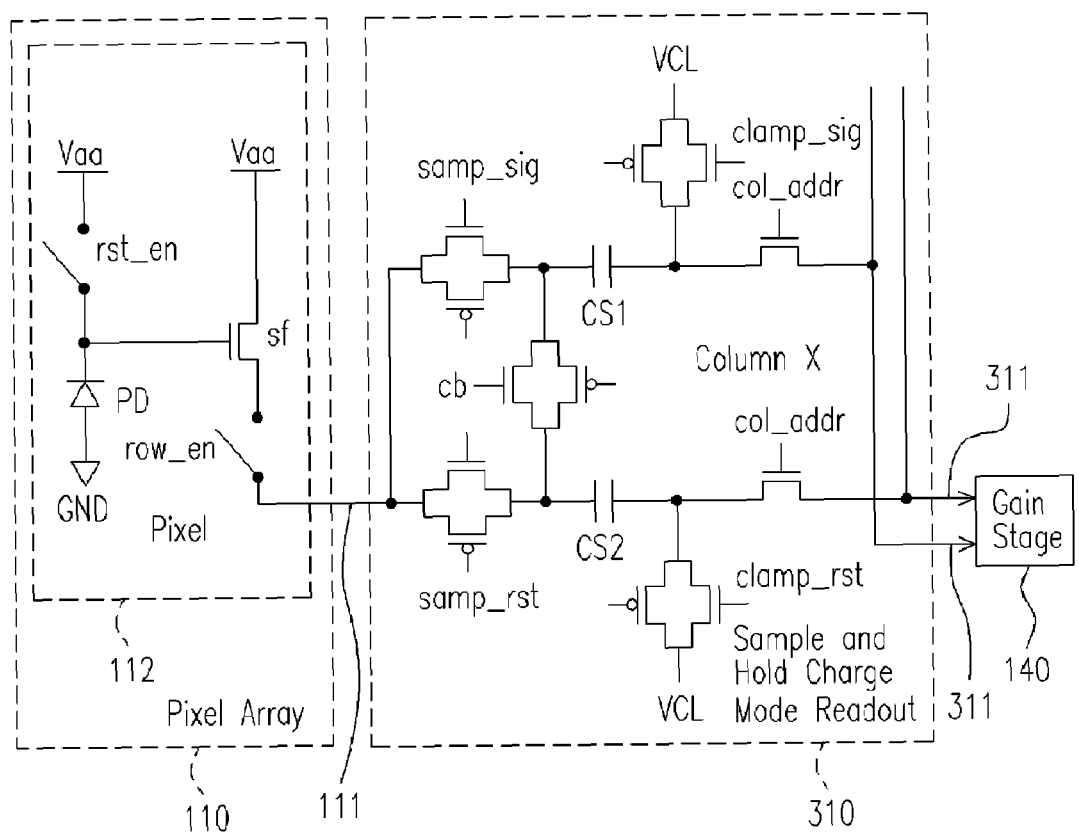
FIG. 3A is a schematic diagram illustrating a signal sampling/holding circuit of a CMOS image sensor according to one embodiment of the present invention.
Figure 3B:
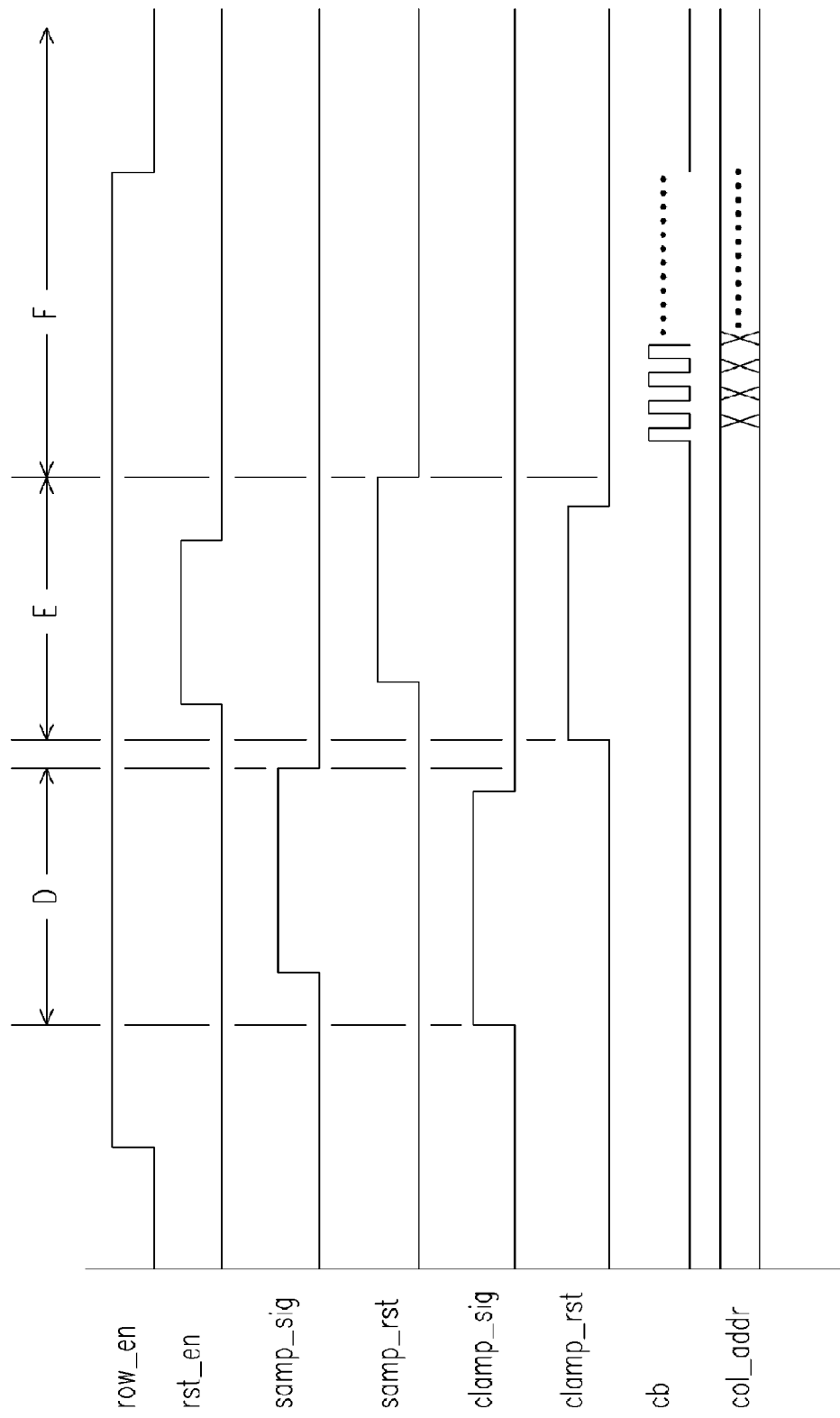
FIG. 3B is a schematic temporal waveform diagram illustrating signals of the sample/hold circuit of the CMOS image sensor in FIG. 3A.

According to the method described above, another embodiment is described in the following for further implementation example. A CMOS image sensor is exemplary in the embodiment. Referring to FIG. 3A, it illustrates a schematic diagram of a signal sampling/holding circuit for a CMOS image sensor according to one embodiment of the present invention. FIG. 3B is a schematic temporal diagram illustrating signals of the CMOS sensor circuit in FIG. 3A. For description convenience in FIGS. 3A and 3B, pixel 112 is referred as one of the pixels in the pixel array 110. Moreover, the pixel signal sampling/holding circuit 310 comprises a plurality of sampling/holding circuits, where one setup is exemplary.

A CMOS image sensor samples a pixel signal value and a reset signal value via the reference voltage VCL. A gate of the signal follower sf is coupled to a cathode of the photo diode PD. During period D for sampling pixel signal value, the control signals row_en, clamp_sig, and samp_sig are switched to high logic level, whereas the control signals rst_en, samp_rst, clamp_rst, cb and col_addr are switched to low logic level. Where switching the control signal clamp_sig to high logic level before switching the control signal samp_sig to high logic level, for example. A reverse bias potential across the photo diode PD is relatively lowered after radiated by light, outputted from which a corresponding potential difference between the pixel signal value and the reference voltage VCL is stored in the capacitor CS1. After signal is sampled, the control signal clamp_sig is switched to low logic level before the control signal samp_sig is switched to the low logic level, such that the pixel signal value is held in the capacitor CS1. Moreover, the reference voltage VCL is disconnected from the capacitor CS1, such that a noise caused by switching sampling switch (i.e., switching the control signal samp_sig to low logic level) is regardless with the potential stored in the capacitor CS1. Therefore, sampling noise is lowered, and a front-end S/N ratio is reduced.

During period E for sampling the reset signal value, the control signals row_en, rst_en, clamp_rst and samp_rst are switched to high logic level, and the control signals samp_sig, clamp_sig, cb and col_addr are switched to low logic level. Where the control signal clamp_rst is switched to high logic level before the control signal samp_rst is switched to high logic level, for example. A cathode of the photo diode PD is re-coupled to the system potential Vaa, such that a corresponding reset signal value is outputted from signal follower sf A potential difference between the reset signal value and the reference voltage VCL is stored in the capacitor CS2. As the signal is sampled, the control signal clamp_rst is switched to the low logic level before the control signal samp_rst is switched to the low logic level, such that the pixel signal value is stored in the capacitor CS1. Since the reference voltage VCL is disconnected from the capacitor CS2 firstly, the noise caused by switching off the sampling switch (i.e., switching the control signal samp_rst to a low logic level) is regardless with the potential stored in the capacitor CS2. Therefore, sampling noise is lowered, and the front-end S/N ratio of the circuit is reduced as well.

After period D for sampling pixel signal value and period E for sampling reset signal value, proceeding to period F signal value holding. During period F or signal value holding, each of the pixel signals 111 of each column is held in a corresponding sampling/holding circuit, and each sensing switch controlled by the control signals cb and col_addr are turned on sequentially by the sampling/holding circuit, such that pixel signal 311 (including pixel signal value and reset signal value) is outputted to the gain stage 140 in sequence. The sensing switches in this embodiment are implemented with transmission gates, for example.

Figure 4:
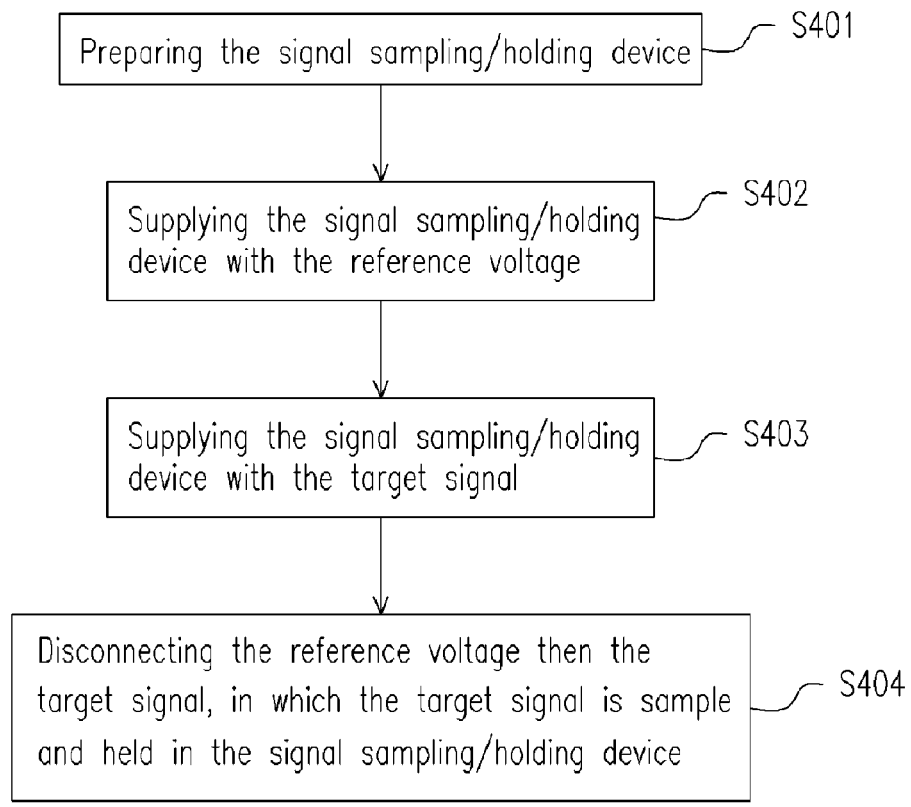
FIG. 4 is a schematic flowchart diagram illustrating a signal sampling/holding method according to another embodiment of the present invention.

Another embodiment of the present invention is provided hereinafter for further description for steps of signal sampling/holding method. Referring to FIG. 4, it illustrates a schematic flowchart diagram of the signal sampling/holding method according to one embodiment of the present invention. In FIG. 4, providing a signal sampling/holding device firstly (step S401). Proceeding to step S402, coupling the reference voltage to the signal sampling/holding device, and coupling the target signal to the signal sampling/holding device (step S403). After the signal is sampled, the reference voltage is disconnected from the signal sampling/holding device before the target signal is. The target signal is sampled and held in the signal sampling/holding device. The target signal in the embodiment of the present invention is exemplary a voltage signal, for example, or an image sensing signal.

Figure 5:
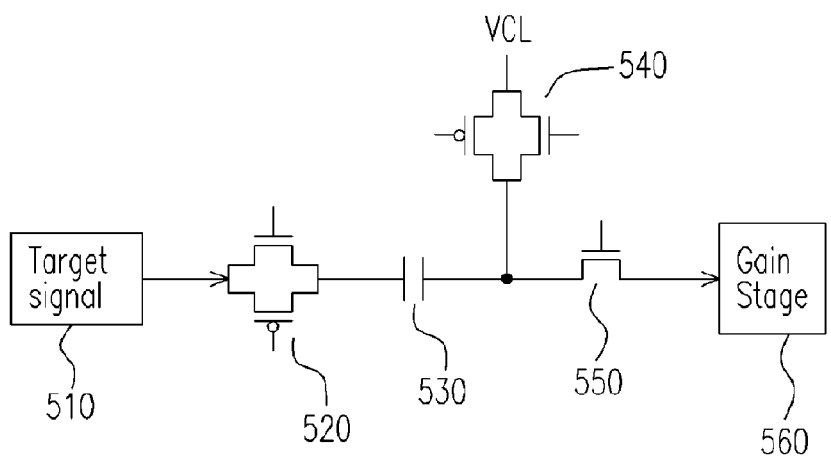
FIG. 5 is a schematic diagram illustrating a signal sampling/holding circuit according to another embodiment of the present invention.

For further depicting the foregoing embodiment, another embodiment is described hereinafter. Referring to FIG. 5, a sampling/holding circuit is illustrated herein. In FIG. 5, the sampling/holding circuit is coupled to the target signal 510 and the gain stage 560 A terminal of a sensing switch 520 is coupled to the target signal 510, whereas the other terminal of the sensing switch is coupled to the signal sampling/holding device 530. The signal sampling/holding device 530 is implemented with a capacitor, for example. A terminal of the sensing switch 540 is coupled to the reference voltage VCL, whereas the other terminal of the sensing switch 540 is coupled to the signal sampling/holding device 530 from which the sampled signal is read. The sampled signal is transmitted to the gain stage 560 through the sensing switch 550. The sensing switches 520 and 540 are implemented with transmission gates, for example.

When the target signal 510 is to be sampled, the sensing switches 520 and 540 are turned on, and the sensing switch 550 is turned off, such that the target signal 510 is sampled and held in the signal sampling/holding device 530. As the signal is sampled, disconnecting the reference voltage VCL (i.e., turning off the sensing switch 540) before disconnecting the sensing switch 520, such that the sampled result is held in the signal sampling/holding device 530. Since the reference voltage VCL is disconnected from the signal sampling/holding device 530 firstly, the noise caused by switching off the sensing switch (referring to sensing switch 520) is regardless with the potential stored in the signal sampling/holding device 530. Therefore, sampling noise is lowered and S/N ratio is improved according to the embodiment.

Although the invention has been described with reference to a particular embodiment thereof, it will be apparent to those skilled in the art that modifications to the described embodiment may be made without departing from the spirit of the invention. Accordingly, the scope of the invention will be defined by the attached claims and not by the above detailed description.

What is claimed is:

1. A method of signal sampling/holding, for a signal sampling/holding circuit, the signal sampling/holding circuit having a first signal sampling/holding device, a second signal sampling/holding device, a target signal source and a reference voltage, the signal sampling/holding method comprising:

coupling the reference voltage to the first signal sampling/holding device before coupling the target signal source to the first signal sampling/holding device for sampling the target signal source;

coupling the reference voltage to the second signal sampling/holding device before coupling the target signal source to the second signal sampling/holding device for sampling the target signal source;

disconnecting the reference voltage from the first signal sampling/holding device before disconnecting the target signal source for holding the target signal source sampled in the first signal sampling/holding device, wherein there is a first period during which the reference voltage and the target signal source are both coupled to the first signal sampling/holding device; and disconnecting the reference voltage from the second signal sampling/holding device before disconnecting the target signal source for holding the target signal source sampled in the second signal sampling/holding device, wherein there is a second period during which the reference voltage and the target signal source are both coupled to the second signal sampling/holding device.

2. The method as recited in claim 1, wherein after the target signal source is sampled and held in the first signal sampling/holding device, then the target signal source is sampled and held in the second signal sampling/holding device.

3. The method as recited in claim 1, wherein the target signal source comprises a voltage source.

4. The method as recited in claim 1, wherein the target signal source comprises an image sensing signal.

5. A circuit for signal sampling/holding, coupled to a target signal source and a reference voltage, the signal sampling/holding circuit sampling and holding the target signal source in response to the reference voltage and outputting a first voltage signal and a second voltage signal, the circuit comprising:

a first signal sampling/holding device, having a first terminal and second terminal;

a second signal sampling/holding device, having a third terminal and a fourth terminal;

a first sensing switch, wherein a terminal of the first sensing switch is coupled to the first terminal and the first voltage signal is read therefrom, and an other terminal of the first sensing switch is coupled to the reference voltage;

a second sensing switch, wherein a first terminal is coupled to the second terminal, and an other terminal of the second sensing switch is coupled to the target signal source;

a third sensing switch, wherein a terminal of the third sensing switch is coupled to the third terminal and the second voltage signal is read therefrom, and an other terminal of the third sensing switch is coupled to the reference voltage; and a fourth sensing switch, wherein a terminal of the fourth sensing switch is coupled to the fourth terminal, and an other terminal of the fourth sensing switch is coupled to the target signal source, wherein as the target signal source is sampled by the first signal sampling/holding device, the first sensing switch is turned on before the second sensing switch is tuned on, there is a first period during which the first and the second sensing switches are both turned on and then the first sensing switch is turned off before the second sensing switch is turned off for holding and outputting the first voltage signal, and as the target signal source is sampled by the second signal sampling/holding device, the third sensing switch is turned on before the fourth sensing switch is turned on, there is a second period during which the third and the fourth sensing switches are both turned on and then the third sensing switch is turned off before the fourth sensing switch is turned off for holding and outputting the second voltage signal.

6. The circuit as recited in claim 5 further comprising a fifth sensing switch, wherein one terminal of the fifth sensing switch is coupled to the second terminal, an other terminal of the fifth sensing switch is coupled to the fourth terminal.

7. The circuit as recited in claim 5, wherein the first signal sampling/holding device and the second signal sampling/holding device comprise capacitors.

8. The circuit as recited in claim 5, wherein the circuit is used for a readout circuit of an image sensor.

9. The circuit as recited in claim 8, wherein the image sensor comprises a CMOS image sensor.

10. A method of signal sampling/holding, comprising:
providing a signal sampling/holding device;
coupling a reference voltage to the signal sampling/holding device before coupling a target signal to the signal sampling/holding device for sampling the target signal; and
disconnecting the reference voltage before disconnecting the target signal from the signal sampling/holding device for holding the target signal sampled in the signal sampling holding device, wherein there is a period during which the reference voltage and the target signal are both coupled to the signal sampling/holding device.

11. The method as recited in claim 10, wherein the target signal comprises a voltage signal.

12. The method as recited in claim 10, wherein the target signal comprises an image sensing signal.

13. A circuit of signal sampling/holding, coupled to a target signal and a reference voltage, the signal sampling/holding circuit sampling and holding the target signal in response to the reference voltage, the circuit comprising:
a signal sampling/holding device, having a first terminal and a second terminal;
a first sensing switch, wherein a terminal of the first sensing switch is coupled to the first terminal, and an other terminal of the first sensing switch is coupled to the reference voltage; and
a second sensing switch, wherein a terminal of the second sensing switch is coupled to the second terminal, and an other terminal of the second sensing switch is coupled to the target signal,
wherein the first sensing switch is turned on before the second sensing switch is turned on for sampling the target signal, the first sensing switch is turned off before the second sensing switch is turned off for holding a sampled result, and there is a period during which the first and the second sensing switches are both turned on.

14. The circuit as recited in claim 13, wherein the signal sampling/holding device comprises a capacitor.

15. The circuit as recited in claim 13, wherein the circuit is used for a readout circuit of an image sensor.

16. The circuit as recited in claim 15, wherein the image sensor comprises a CMOS image sensor.

\* \* \* \* \*